United States Patent
Pawelkowski et al.

(10) Patent No.: US 12,097,768 B2
(45) Date of Patent: Sep. 24, 2024

(54) CONFIGURABLE POWER INVERTER

(71) Applicant: Mercedes-Benz Group AG, Stuttgart (DE)

(72) Inventors: Eric Pawelkowski, Macomb, MI (US); Agasthya Ayachit, Troy, MI (US)

(73) Assignee: Mercedes-Benz Group AG, Stuttgart (DE)

( * ) Notice: Subject to any disclaimer, the term of this patent is extended or adjusted under 35 U.S.C. 154(b) by 0 days.

(21) Appl. No.: 18/147,125

(22) Filed: Dec. 28, 2022

(65) Prior Publication Data

US 2024/0181888 A1 Jun. 6, 2024

Related U.S. Application Data

(63) Continuation of application No. 18/073,261, filed on Dec. 1, 2022.

(51) Int. Cl.
| | |
|---|---|
| B60L 1/00 | (2006.01) |
| B60L 15/20 | (2006.01) |
| B60L 50/51 | (2019.01) |
| B60L 50/60 | (2019.01) |
| H02M 1/00 | (2007.01) |

(Continued)

(52) U.S. Cl.
CPC ........... *B60L 1/003* (2013.01); *B60L 15/2045* (2013.01); *B60L 50/51* (2019.02); *B60L 50/60* (2019.02); *H02M 1/0058* (2021.05); *H02M 7/537* (2013.01); *H02M 7/53871* (2013.01); *H03K 17/08142* (2013.01); *H05K 7/20218* (2013.01); *H05K 7/2039* (2013.01); *H05K 7/20927* (2013.01); *B60L 2210/10* (2013.01); *B60L 2210/30* (2013.01); *B60L 2210/40* (2013.01)

(58) Field of Classification Search
CPC ...... B60L 1/003; B60L 50/60; B60L 15/2045; B60L 2210/10; B60L 2210/30; H02M 1/0058; H02M 7/537; H03K 17/08142; H05K 7/2039

See application file for complete search history.

(56) References Cited

U.S. PATENT DOCUMENTS

| | | |
|---|---|---|
| 4,532,443 A | 7/1985 | Glennon |
| 10,404,188 B2 | 9/2019 | Saha et al. |

(Continued)

FOREIGN PATENT DOCUMENTS

| | | |
|---|---|---|
| KR | 20040001258 A | 1/2004 |
| KR | 20200009361 A | 1/2020 |
| WO | 2010000315 A1 | 1/2010 |

OTHER PUBLICATIONS

International Search Report and Written Opinion for Application No. PCT/EP2023/082438, mailed Feb. 14, 2024, 17 pages.

(Continued)

*Primary Examiner* — Jared Fureman
*Assistant Examiner* — Duc M Pham
(74) *Attorney, Agent, or Firm* — Dority & Manning, P.A.

(57) ABSTRACT

Subject matter disclosed herein may relate to electronic systems, devices, and/or modules such as a power inverter that is configurable and may have input power ports to receive the direct current voltage, a plurality of output power ports to provide single-phase, two-phase, or phase alternating current power, and signal ports to receive commands to select single-phase, two-phase, or three-phase alternating current power.

18 Claims, 4 Drawing Sheets

(51) Int. Cl.
*H02M 7/537* (2006.01)
*H02M 7/5387* (2007.01)
*H03K 17/0814* (2006.01)
*H05K 7/20* (2006.01)

(56) References Cited

U.S. PATENT DOCUMENTS

| | | | |
|---|---|---|---|
| 11,400,821 B2* | 8/2022 | Galin | H02J 3/38 |
| 2006/0086981 A1 | 4/2006 | Yamaguchi et al. | |
| 2006/0186854 A1 | 8/2006 | Ho et al. | |
| 2007/0267926 A1 | 11/2007 | Hauenstein | |
| 2008/0174966 A1 | 7/2008 | Badger et al. | |
| 2009/0184760 A1 | 7/2009 | Hauenstein | |
| 2011/0085363 A1 | 4/2011 | Gupta et al. | |
| 2016/0099665 A1 | 4/2016 | Chen et al. | |
| 2017/0162466 A1 | 6/2017 | Sawada | |
| 2017/0222641 A1 | 8/2017 | Zou et al. | |
| 2017/0232831 A1 | 8/2017 | Agata et al. | |
| 2017/0264284 A1 | 9/2017 | Xu et al. | |
| 2017/0274776 A1 | 9/2017 | Xu et al. | |
| 2017/0305274 A1 | 10/2017 | Saha et al. | |
| 2017/0327001 A1 | 11/2017 | Lu et al. | |
| 2019/0255960 A1* | 8/2019 | Töns | H02M 7/5387 |
| 2019/0295932 A1 | 9/2019 | Nakata et al. | |
| 2020/0021234 A1* | 1/2020 | Xiao | H02P 29/50 |
| 2021/0221249 A1 | 7/2021 | Ge et al. | |
| 2021/0344281 A1 | 11/2021 | Matsuyama et al. | |
| 2022/0149752 A1 | 5/2022 | Trenz et al. | |
| 2022/0158540 A1 | 5/2022 | Zhang et al. | |
| 2022/0200467 A1* | 6/2022 | Andris | H02M 7/53871 |
| 2022/0255348 A1* | 8/2022 | Afridi | B60L 53/10 |

OTHER PUBLICATIONS

Luo et al., "Anvanced DC/AC inverters; applications in renewable energy", CRC Press 2013, 9 pages.

Mazda, "Power electronic handbook; components, circuits and applications", Butterworth & Co. Ltd. 1990, 4 pages.

* cited by examiner

CONFIGURABLE POWER INVERTER

CROSS-REFERENCE TO RELATED APPLICATION(S)

The present application is a continuation of U.S. patent application Ser. No. 18/073,261, entitled "CONFIGURABLE POWER INVERTER" and filed on Dec. 1, 2022, the content of which is incorporated by reference in its entirety.

BACKGROUND

Field

Subject matter disclosed herein may relate to electronics modules utilized in the conversion of direct current (DC) input power to alternating current (AC) output power for use in, for example, electrified vehicles. More specifically, the subject matter disclosed herein may relate to, for example, a configurable power inverter that may be powered by a low-voltage regulated power supply and may power low-voltage components in the electrified vehicles.

Information

As electrified vehicles, such as electrified automobiles, delivery trucks, and cargo vehicles, become increasingly prevalent, the need for onboard electric power-conditioning and/or power conversion equipment has also increased. Such power-conditioning and/or power conversion equipment may include DC-to-DC converters, which operate to convert DC power of a first voltage to DC power of a second voltage, as well as DC-to-AC converters (e.g., a DC-to-AC inverter), which operate to convert DC input power to AC output power. For example, certain automobile equipment, such as onboard infotainment systems, may operate in response to receiving DC input power. Other equipment, such as motorized equipment (e.g., air conditioning compressors, water pumps, low-voltage motors, etc.) may operate in response to receiving AC input power. It may be appreciated that in designing equipment for use in automobile environments, a premium may be placed on reducing equipment size and weight, so as to provide increased capacity for passengers and cargo. Accordingly, development of highly integrated equipment continues to be an active area of investigation.

SUMMARY

One general aspect includes an electronics module to operate as a configurable power inverter, the electronics module may include switching circuitry arranged to convert DC input power into single-phase, two-phase, or three-phase alternating current output power. The electronics module may additionally include one or more switch controllers to operate to receive, as a first set of input signals, input signals from a communications bus to direct operation of the switching circuitry to generate the single-phase, two-phase, or three-phase AC output power, and to receive, as a second set of input signals, input signals from the communications bus to implement soft turn on and/or substantially zero-current switching of the AC output power.

In particular embodiments, the one or more switch controllers additionally operate to receive input signals from the communications bus to implement soft turn on and substantially zero-current switching of the AC output power. In particular embodiments, the electronics module further includes a heatsink, coupled to the switching circuitry, to receive thermal energy generated by the switching circuitry. In particular embodiments, the heatsink of the electronics module includes provisions for liquid cooling of the heatsink. In particular embodiments, the electronics module further includes a substrate in contact with the heatsink, the substrate to accommodate one or more capacitive devices to provide DC-link capacitance between a DC input power portion, which is a portion of the DC input power, and an AC output power portion, which is a portion of the AC output power) of the electronics module. In particular embodiments, at least one capacitive device of the one or more capacitive devices includes a planar capacitor. In particular embodiments, the communications bus corresponds to a controller area network (CAN) or a local interconnect network (LIN) communications bus. In particular embodiments, the electronics module receives the DC input power to have a low voltage of between approximately 12.0 Volts and approximately 60.0 Volts. In particular embodiments, the one or more switch controllers receives at least one separate regulated voltage supply of approximately 12.0 Volts. In particular embodiments, the switching circuitry includes transistor elements that utilize a semiconductor material having a band gap of at least 2.5 electron volts. In particular embodiments, the semiconductor material includes silicon carbide or gallium nitride.

Another general aspect includes an electronics module that includes a switch block, the switch block to receive DC power and to generate AC power. The electronics module also includes a control block, the control block to transmit signals to the switch block, the transmitted signals to direct the switch block to generate single-phase, two-phase, or three-phase AC power. The electronics module also includes a heatsink block, the heatsink block to receive thermal energy from the switch block and to dissipate the thermal energy. The electronics module also includes a filter block coupled to the heatsink block, the filter block to introduce a capacitance between an input power portion of the switch block and an output power portion of the switch block.

In particular embodiments, the filter block of the electronics module further includes a substrate, coupled to the heatsink block, to accommodate components of the filter block. In particular embodiments, the filter block includes at least one planar capacitor. In particular embodiments, the switch block further includes a first power port to receive a low-voltage supply of between approximately 12 Volts and approximately 60 Volts from a low-voltage storage component. In particular embodiments, the control block further includes a second power port to receive a low-voltage regulated power supply of between approximately 9 Volts and approximately 14 Volts. In particular embodiments, the control block further includes a serial interface, the serial interface to facilitate programming of one or more logic modules of the control block. In particular embodiments, programming of the one or more logic modules of the control block includes programming commands to generate substantially zero-current switching of switch elements of the switch block.

Another general aspect includes a vehicle having one or more batteries. The vehicle also includes one or more input power ports to receive DC power. The vehicle also includes a prepackaged electronics module having a plurality of output power ports to provide single-phase, two-phase, or three-phase AC power. The prepackaged electronics module also includes a first set of one or more input power ports, the first set of one or more input signal ports to receive commands to select the single-phase, the two-phase, or the three-phase AC power. The vehicle also includes one or more pieces of equipment of the vehicle to receive the single-phase, the two-phase, or the three-phase AC power.

In particular embodiments, the prepackaged electronics module further includes one or more fluid input ports to receive a fluid from an external source and to convey the fluid to a heatsink. In particular embodiments, the prepackaged electronics module further includes a second set of one or more input signal ports, the second set of the one or more input signal ports to receive programming commands In particular embodiments, the programming commands to bring about substantially zero-current switching of switch elements of the prepackaged electronics module.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Figure 1:
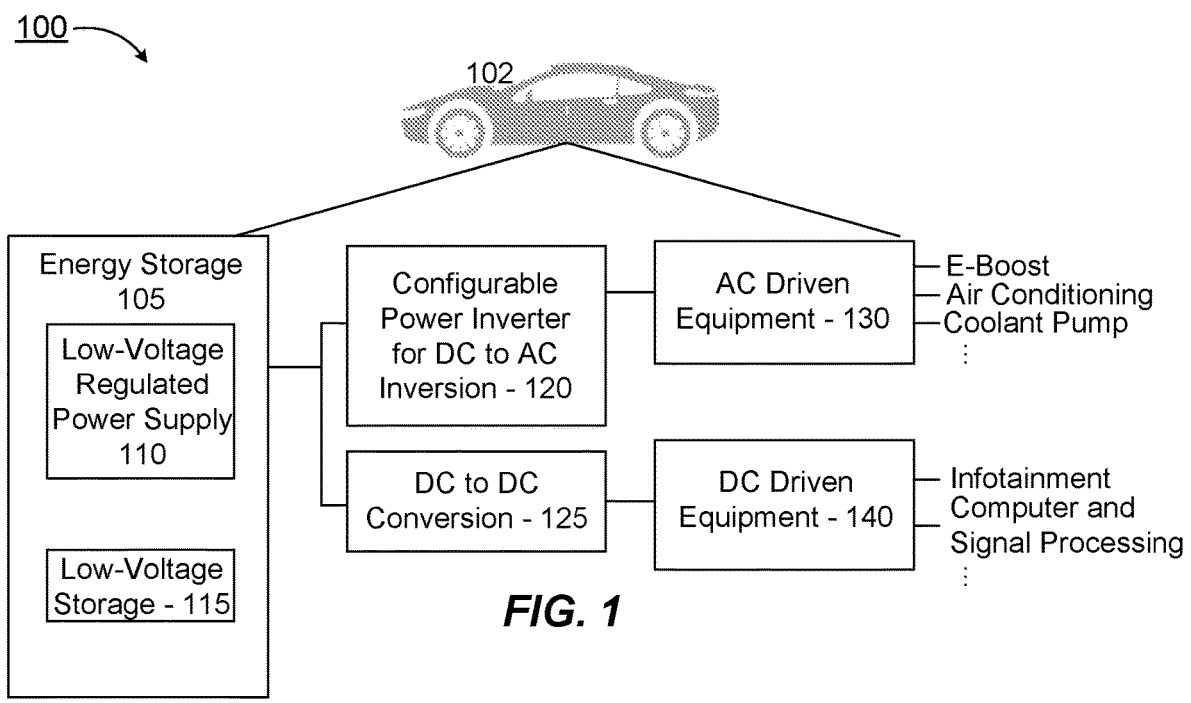
FIG. 1 is a block diagram depicting a portion of an example power distribution system for use in an electrified vehicle, according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. In addition, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, the particular context of description and/or usage provides helpful guidance regarding inferences to be drawn.

As previously alluded to, in response to an increased popularity of electrified automobiles, delivery trucks, and cargo vehicles, a need for onboard electric power conditioning and/or power conversion equipment has also increased. In this context, the term "electrified" vehicle refers to a wide variety of vehicles, such as those driven purely by an electromotive force from one or more electric motors, as well as hybrid vehicles, which may be occasionally driven via an electromotive force as well as via an internal combustion engine. In an electrified vehicle, electric power conversion equipment may operate to convert stored energy, for example from one or more onboard storage batteries, into an appropriate DC voltage or into an appropriate AC voltage. In some instances, for example, a direct current from one or more batteries of a certain voltage (or, more specifically, a certain voltage amplitude or voltage value) may be converted to a different direct current voltage (or, more specifically, a different voltage amplitude or voltage value), so as to power an onboard infotainment system, a computer processor, a signal processor, and so forth. In other instances, a DC) voltage from one or more batteries may be converted to an AC voltage, so as to power an onboard motor, such as an air conditioner compressor unit, an electrically-driven water or coolant pump, or any other motorized device onboard an electrified vehicle.

In some instances, an electrified vehicle may employ customized power conversion equipment, such as inverters, which may be matched to operate with particular pieces of electronics equipment. For example, a single-phase AC electric motor may be, in some instances, matched or paired with a particular DC to AC inverter that generates single-phase AC electric power. In another example, a three-phase AC electric motor may be matched or paired with a particular DC to AC inverter that generates three-phase AC electric power. Thus, a supply chain for a particular model of electrified vehicle may be required to provision, for example, several types of inverters so that a particular inverter type may be readily available in response to a need for the electrified vehicle such as a hybrid electrified vehicle.

In certain electrified vehicles, particular power conversion components, such as inverters, may be designed with a substantial number (such as 16 or more) of switching devices (also referred to as switching elements), which provide three-phase AC power. However, it may be appreciated that synchronization and/or coordination of the switching devices of the inverter, for example, which may operate to ensure that each switching device transitions at the correct instance, may be problematic. Further, in at least some instances, failure to synchronize and/or properly coordinate among switching devices of an inverter may degrade operation of AC-driven equipment or even bring about damage to the AC-driven equipment. In other instances, failure to synchronize and/or coordinate among switching devices may bring about damage to an inverter, thereby inactivating equipment normally powered by the inverter.

In some instances, power conversion equipment on board an electrified vehicle, such as a DC to AC inverter, may generate significant excess thermal energy responsive to internal resistances of switching devices. However, despite the potential for substantial excess thermal energy generation, an inverter, for example, may not be adequately cooled. Consequently, switching devices of an inverter may be prone to heat-induced failure, which, again, may inactivate equipment normally powered by the inverter. Further, such unabated generation of excess thermal energy may bring about rises in the temperature of adjacent equipment, which may contribute to failures of the adjacent equipment as well.

As previously alluded to, in designing equipment for use in an electrified vehicle, a premium may be placed on reducing equipment weight and size so as to provide, for example, increased space for accommodating passengers and cargo. Thus, it may be useful to design electrified vehicle equipment and systems in a manner that reduces parts required to perform particular functions. It may be additionally useful to design electrified vehicle equipment and systems that exhibit flexibility, so as to permit certain equipment to be used to power differing types of devices. By way of these design considerations, an electrified vehicle may be designed utilizing certain equipment that can be employed for a variety of applications, thereby reducing the vehicle's parts count. A reduction in a vehicle's parts count may reduce the overall cost of the vehicle and may additionally reduce logistical support needed for maintaining an electrified vehicle after its purchase.

FIG. 1 is a block diagram depicting a portion of an example power distribution system for use in an electrified vehicle, according to an embodiment 100. In FIG. 1, electrified vehicle 102 (also referred to as an electric vehicle or EV) may include a variety of other hardware and software systems, subsystems, modules, assemblies, and components, which bring about various driving, handling, communications, entertainment, and other capabilities of electrified vehicle 102. However, for the sake of simplicity, only a portion of the power storage and distribution system utilized by electrified vehicle 102 is shown in FIG. 1. It should be noted that electrified vehicle 102 may correspond to any type of vehicle, such as an electrified automobile, an electrified delivery vehicle, an electrified cargo vehicle, and so forth, or may correspond to a vehicle that, at least occasionally utilizes, an internal combustion engine (e.g., gasoline, diesel, liquid natural gas, etc.) and claimed subject matter is not limited in this respect.

More particularly, FIG. 1 illustrates an electric vehicle 102 which includes an energy storage 105 (also referred to as an energy storage device), a configurable power inverter 120 for DC-to-AC inversion, a DC conversion module 125 for DC-to-DC conversion (also referred to as a DC-to-DC converter), AC driven equipment 130, and DC driven equipment 140. In the embodiment of FIG. 1, energy storage 105 may comprise high-voltage storage (not shown), which may include one or more chemical storage elements (e.g., batteries), that operate to convert chemical energy to an electric current having a voltage (or more specifically, a voltage amplitude) of greater than 60 Volts. Energy storage 105 may additionally include a separate voltage supply such as low-voltage regulated power supply 110, which may include one or more batteries such as lithium ion batteries that convert chemical energy to an electric current having a voltage of, for example, between 9 Volts and 14 Volts, such as a nominal voltage of 12 Volts. Energy storage 105 may also include a low-voltage storage 115 (also referred to as a low-voltage storage device), which may include one or more chemical storage elements (e.g., batteries) that convert chemical energy to an electric current having a voltage of, for example, between 12 Volts and 160 Volts, such as 18 Volts, 24 Volts, 32 Volts, 36 Volts, 48 Volts, and so forth. Energy storage 105 may additionally include other chemical energy storage elements, such as storage elements to provide backup and/or emergency power, for example.

As stated above, embodiment 100 also includes power conditioning modules, such as configurable power inverter 120 for DC to AC conversion and includes DC to DC conversion module 125. The configurable power inverter 120 may be supplied by the low-voltage regulated power supply 110. The DC to DC conversion module 125 may operate to provide primary power to DC driven equipment 140, which may include various computers and/or computing equipment, such as infotainment modules, signal processing modules, lighting modules, and so forth. Configurable power inverter 120 may be configurable and provide primary power to AC driven equipment 130. In some implementations, AC driven equipment 130 may include a booster module that operates to provide power to an additional electric motor to occasionally boost performance of electrified vehicle 102. AC driven equipment 130 may additionally include other motorized equipment, such as an air conditioner or coolant pump of electrified vehicle 102. Configurable power inverter 120 and DC to DC conversion module 125 may provide power to additional equipment on board electrified vehicle 102, and claimed subject matter is intended to embrace all such additional equipment, virtually without limitation.

Figure 2:
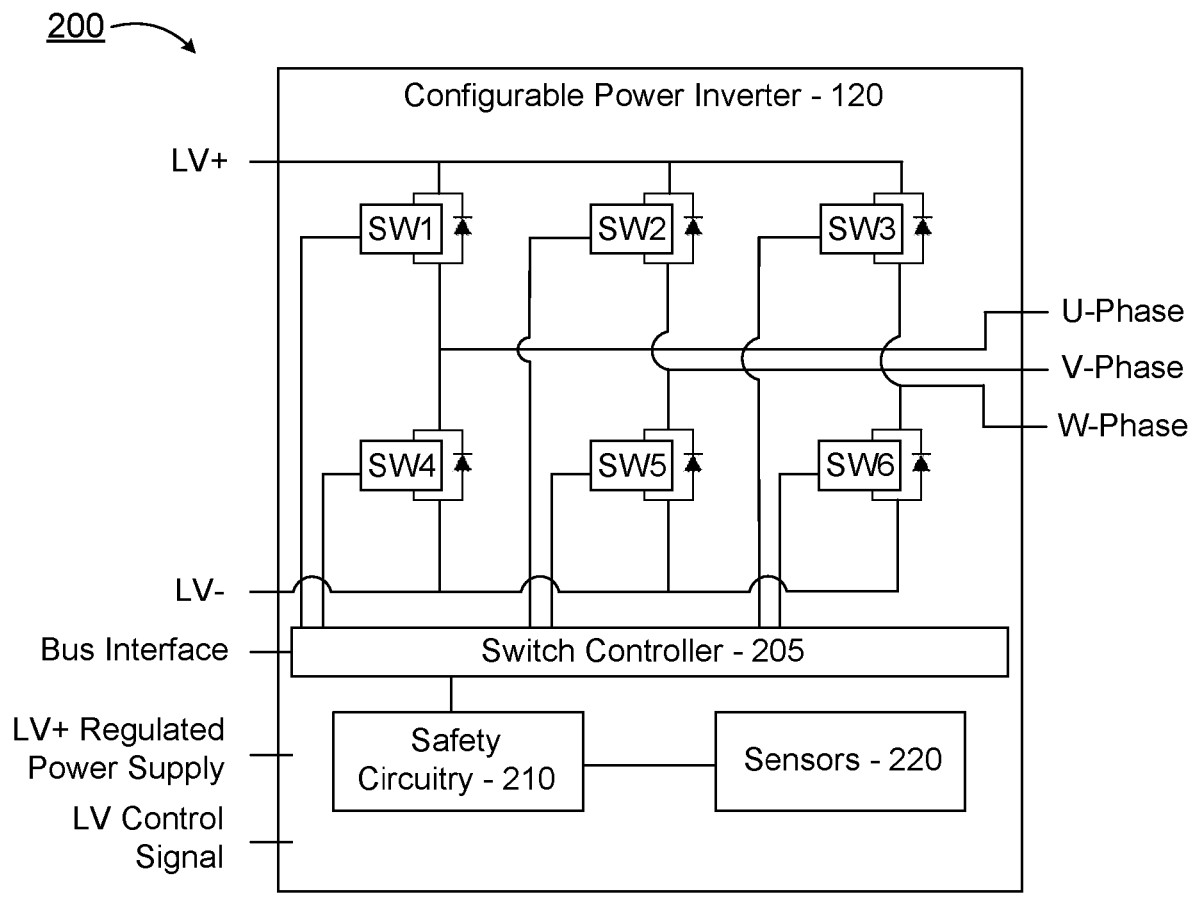
FIG. 2 is a schematic diagram of an example configurable power inverter module, according to an embodiment.

FIG. 2 is a schematic diagram of an example configurable power inverter 120, according to an embodiment 200. In the embodiment of FIG. 2, configurable power inverter 120 may include switching circuitry arranged to convert DC input power into AC output power, and more specifically into single-phase, two-phase, or three-phase AC output power. In embodiment 200, the switching circuitry includes 6 switching devices (also referred to as switching elements or switch elements), which are labeled SW1, SW2, SW3, SW4, SW5, and SW6. In one example, each of SW1-SW6 may be a transistor (also referred to as a transistor element). In particular embodiments, switching devices SW1-SW6 may operate under the control of one or more switch controllers, such as switch controller 205. The switch controller may include, e.g., a microprocessor, a microcontroller, or a programmable state machine (e.g., application specific integrated circuit (ASIC) or field programmable gate array (FPGA)) that operates to control switching devices SW1-SW6. Configurable power inverter 120 may be connected or at least coupled to low-voltage storage 115 (of FIG. 1) via connection LV+ and LV−. Accordingly, configurable power inverter 120 may be capable of providing an alternating current voltage of between, for example, a voltage corresponding to LV− and a voltage corresponding to LV+, both with magnitude in the range of approximately 12 Volts and approximately 60 Volts (or more). Configurable power inverter 120 may additionally include a bus interface, which may facilitate communications via a CAN bus, a LIN bus, and/or any other type of serial bus, for example, which may provide parameters and/or control settings to switch controller 205. Additionally, configurable power inverter 120 may be connected or at least coupled to low-voltage regulated power supply 110 (of FIG. 1), via connection LV+. In an embodiment, configurable power inverter 120 includes safety circuitry 210 and sensors 220. A connection to LV+ may facilitate operation of switch controller 205, safety circuitry 210, and sensors 220 so that configurable power inverter 120 may be brought to an operational state prior to application of low-voltage power, such as via connections LV+ and LV−. In some implementations, configurable power inverter 120 may additionally receive and/or process a low-voltage (LV) control signal, which may permit activation and inactivation (also referred to as deactivation) of switch controller 205, safety circuitry 210, and sensors 220. Although not explicitly indicated in FIG. 2, configurable power inverter 120 may additionally include programming connections, so as to allow memory devices, such as flash memory elements of switch controller 205, to be modified via upload of configurable parameters.

In particular embodiments, the switching devices of FIG. 2 may include transistors, or more specifically may be MOSFET switching devices controlled via gate voltages at respective gates of the MOSFET switching devices. In such embodiments, switch controller 205 may operate to control gate voltages of the MOSFET switching devices. Thus at a first instant (also referred to as a first instance in time), switch controller 205 may generate a voltage over a brief period of time which, for example, brings about current conduction from LV+ through switching device SW1 and outward toward an external device coupled to the U-phase power output of configurable power inverter 120. In an example embodiment, the brief voltage may include or have a duration that corresponds to one half of a duration of an alternating current cycle. After one half of the duration of an alternating current cycle has elapsed, switch controller 205 may remove or at least reduce a voltage applied to switching device SW1, thereby stopping current flow through switching device SW1. Responsive to stopping current flow through switching device SW1, current may cease to flow through the external device coupled to the U-phase power output of configurable power inverter 120. At a second instant (also referred to as a second instance in time), switch controller 205 may generate a voltage over a brief period of time which, for example, may be applied to switching device SW4. Hence, current may conduct in an opposite direction through switching device SW4. At a third instant, switch controller 205 may again generate a voltage over a brief period of time which, for example, may be applied to switching device SW1, thereby, again, bringing about current conduction from LV+ through switching device SW1 and outward toward an external device coupled to the U-phase power output of configurable power inverter 120. In such a manner, an alternating electric current may flow to and from electrical equipment coupled to the U-phase power output of configurable power inverter 120.

In a similar manner, switch controller 205 may apply gate voltages to switching devices SW2 and SW5, so as to generate an alternating current at the V-phase power output of configurable power inverter 120. Likewise, switch controller 205 may apply gate voltages to switching devices SW3 and SW6, so as to generate an alternating current at the W-phase power output of configurable power inverter 120. Further, it may be appreciated that responsive to switch controller 205 ceasing to provide output signals (e.g., gate voltages), so as to maintain one or more of switching devices SW1-SW6 in a quiescent state that does not result in current conduction, a particular phase of the U-phase, V-phase, and W-phase may be inactivated. Accordingly, in such a scenario, configurable power inverter 120 may be configured to operate as a source of single-phase AC output power (e.g., exclusively U-phase), a source of two-phase AC output power (e.g., exclusively U-phase and V-phase), or a source of three-phase AC output power (e.g., U-phase, V-phase, and W-phase) under the control of switch controller 205.

Safety circuitry 210 of FIG. 2 may operate to monitor output power signals from sensors 220 and report to switch controller 205. In particular embodiments, safety circuitry 210 may include circuits to monitor excessive temperature, overvoltage, overcurrent, or any other parameter that exceeds predetermined thresholds. In particular embodiments, sensors 220 may include a Hall effect current sensor, which may provide real-time feedback with respect to output current conducted from configurable power inverter 120 to external electrical equipment.

In particular embodiments, switch controller 205 may implement "soft turn on," so as to gradually increase a signal voltage (also referred to as signal voltage amplitude) applied to one or more of switching devices SW1-SW6 of the switching circuitry. In this context, the term "soft turn on" refers to an implementation of a preprogrammed sequence of voltages (also referred to as voltage values or voltage amplitudes) applied to an aspect (e.g., a gate) of a switching element, over a predetermined duration, which facilitates the transition of the switching element from a state of a negligible current conduction (e.g., a current flow of approximately 0 Ampere or an "off" state) to a state of saturation current conduction (e.g. an "on" state). For example, in an embodiment in which one or more of switching devices SW1-SW6 include transistor switching devices (e.g., MOSFET devices), switch controller 205 may apply a predetermined sequence of monotonically increasing voltages to respective gates of one or more of the MOSFET devices. In response, the one or more MOSFET devices may gradually increase current conduction, so as to avoid abrupt transitions between a state of negligible current flow (e.g., approximately 0 Ampere) and a state of saturation current flow. As a consequence of soft turn on of switching devices SW1-SW6, conducted and radiated electromagnetic noise and interference from configurable power inverter 120 (of FIG. 1) may be reduced. In addition, soft turn on may reduce large inrush currents into inductive loads powered by the configurable power inverter, which may serve to protect the inductive load as well as to protect certain aspects of the configurable power inverter 120.

Figure 3A:
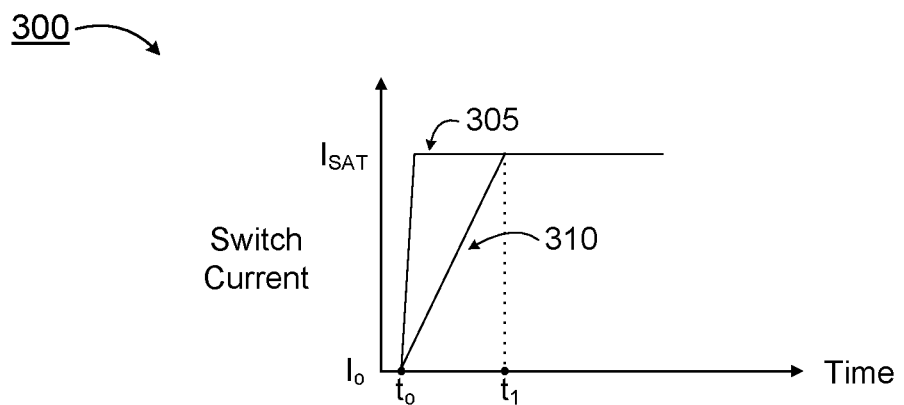
FIG. 3A is a graph depicting switch current as a function of time for abrupt switching and soft turn on of a switching device, according to an embodiment.

In particular embodiments, soft turn on may be implemented via a communications bus (e.g., a LIN, CAN, or other suitable communications network). For example, parameters to implement soft turn on may be uploaded via a series of commands that indicate voltage levels and corresponding timing so as to gradually increase voltage applied to one or more of switching devices SW1-SW6. More particularly, the switch controller 205 may be operable to accept or otherwise receive or obtain input signals from the communications bus (e.g., a CAN bus, a LIN bus or other suitable communications link). In an embodiment, the input signals may include, for example, a first set of input signals which may direct or initiate operation of the switching circuitry to generate or form single-phase, two-phase, or three-phase AC output power. For example, a first set of input signals may indicate a selection of which type of AC output power is to be formed by the switching circuitry, in which the AC output power is selected from among single-phase, two-phase, and three-phase AC output power. Accordingly, switch controller 205 may operate to control the switching devices SW1-SW6 to output the selected type of AC output power. In an embodiment, the input signals may include a second set of input signals to implement soft turn on and/or substantially zero-current switching of the AC output power. AC output power may be formed from DC input power, which may include voltages of between approximately 12 Volts and approximately 60 Volts. FIG. 3A provides an example in which the switch controller 205 implements soft turn on, while FIG. 3B provides an example in which the switch controller 205 implements zero-current switching.

FIG. 3A is a graph depicting switch current as a function of time for abrupt switching and soft turn on of a switching device, according to an embodiment 300. The switch current may refer to current conducting through a switching device. As shown in embodiment 300, at time $t_0$, switch current $I_0$, which may correspond to a negligible current (approximately 0 Ampere) may conduct through a switching device. As shown by current conduction profile 305, without soft turn on, current conducted via the switching device may abruptly ramp from a negligible amount to a saturation amount, such as $I_{SAT}$. However, responsive to soft turn on of a switching device, current conducted via the switching device may gradually ramp from a negligible amount to a saturation amount (e.g., $I_{SAT}$) as shown by current conduction profile 310. In the embodiment of FIG. 3, soft turn on may gradually delay a transition of conducted current, from $I_0$ to $I_{SAT}$, until time $t_1$.

In particular embodiments, switch controller 205 may implement "soft turn on," so as to gradually increase a signal voltage applied to one or more of switching devices SW1-SW6. In this context, the term "soft turn on" refers to an implementation of a preprogrammed sequence of voltages applied to an aspect of a switching element, over a predetermined duration, which facilitates the transition of the switching element from a negligible (approximately 0 Ampere) current conduction to a saturation current conduction. For example, in an embodiment in which one or more of switching devices SW1-SW6 include transistor switching devices (e.g., MOSFET devices), switch controller 205 may apply a predetermined sequence of monotonically increasing voltages to gates of one or more of the MOSFET devices. In response, the one or more MOSFET devices may gradually increase current conduction, so as to avoid abrupt transitions between negligible current flow (e.g., approximately 0 Ampere) and saturation current flow. As a consequence of soft turn on of switching devices SW1-SW6, conducted and radiated electromagnetic noise and interference from configurable power inverter 120 may be reduced. In addition, soft turn on may reduce large inrush currents into inductive loads powered by configurable power inverter 120, which may serve to protect the inductive load as well as to protect certain components of configurable power inverter 120.

Figure 3B:
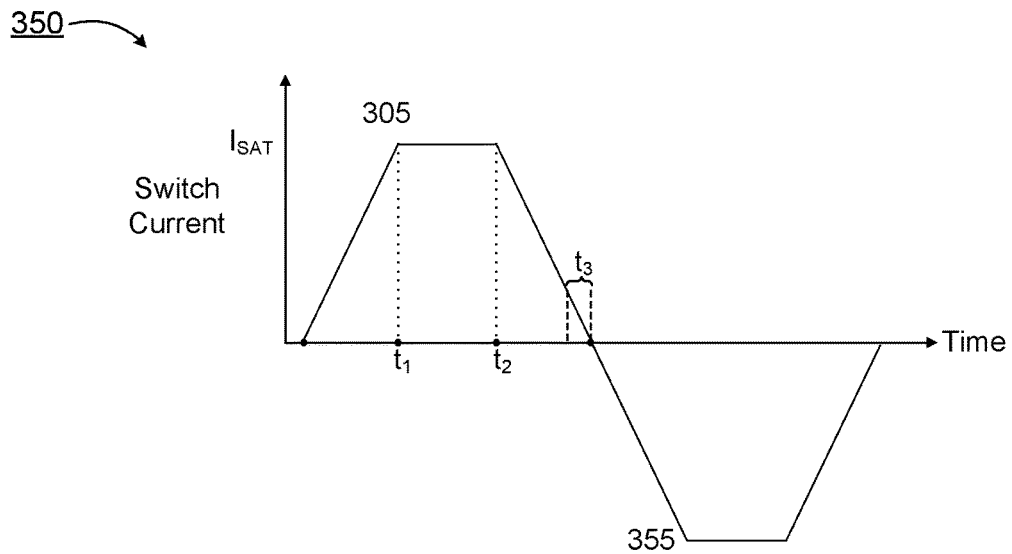
FIG. 3B is a graph depicting substantially zero-current switching of a switching device as a function of time, according to an embodiment.

FIG. 3B is a graph depicting substantially zero-current switching of a switching device as a function of time, according to an embodiment 350. As shown in embodiment 350, at time $t_1$ (via soft turn on), current conducted through a switching device (e.g., SW1) has attained a value of approximately $I_{SAT}$, as shown by current conduction profile 305 previously described in reference to FIG. 3A. At time $t_2$, responsive to, for example, a gradually downward ramping of a power signal applied to switching device SW1, current conducted through switching device SW1 may approach an approximately zero or negligible value. In the embodiment of FIG. 3B, responsive to current conduction approaching an approximately zero or negligible value, one or more of sensors 220 may indicate to controller 205 that current conducted through SW1 has approached a negligible (or substantially zero) value, such as approximately at time $t_3$. In turn, controller 205 may gradually apply a voltage to a second switching device (e.g., SW4), which may gradually increase current conduction through the switching device as shown by current conduction profile 355. Accordingly, in this context, the term "substantially zero-current" switching or "zero-current" switching refers to performing a switching operation while conducted current drops below a threshold of 10 percent of a saturation current ($I_{SAT}$). In a simple example, for a saturated current level of 1.0 Ampere, substantially zero-current switching would take place responsive to sensors 220 indicating that conducted current has fallen below 100 milliampere.

Thus, as shown in FIG. 3B, switching devices (e.g., SW1 and SW4) of a configurable power inverter 120 (of FIG. 1) may be switched by controller 205 responsive to very little or negligible (e.g., near zero) currents conducting through a switching device. In particular embodiments, such substantially zero-current switching reduces an amount of unusable current, which may be dissipated via shunting to a ground potential. Accordingly, by way of substantially zero-current switching, efficiency of configurable power inverter 120 can be increased. Further, responsive to substantially zero-current switching, which minimizes shunting of excess current to a ground potential, current-induced heating (which may be based on a current amplitude "I" and a resistance of the switching device "R," based on $I^2R$) of switching devices may be reduced. Such reductions in current-induced heating may assist in maintaining a low operating temperature, which may increase device reliability, device longevity, and so forth.

Figure 4:
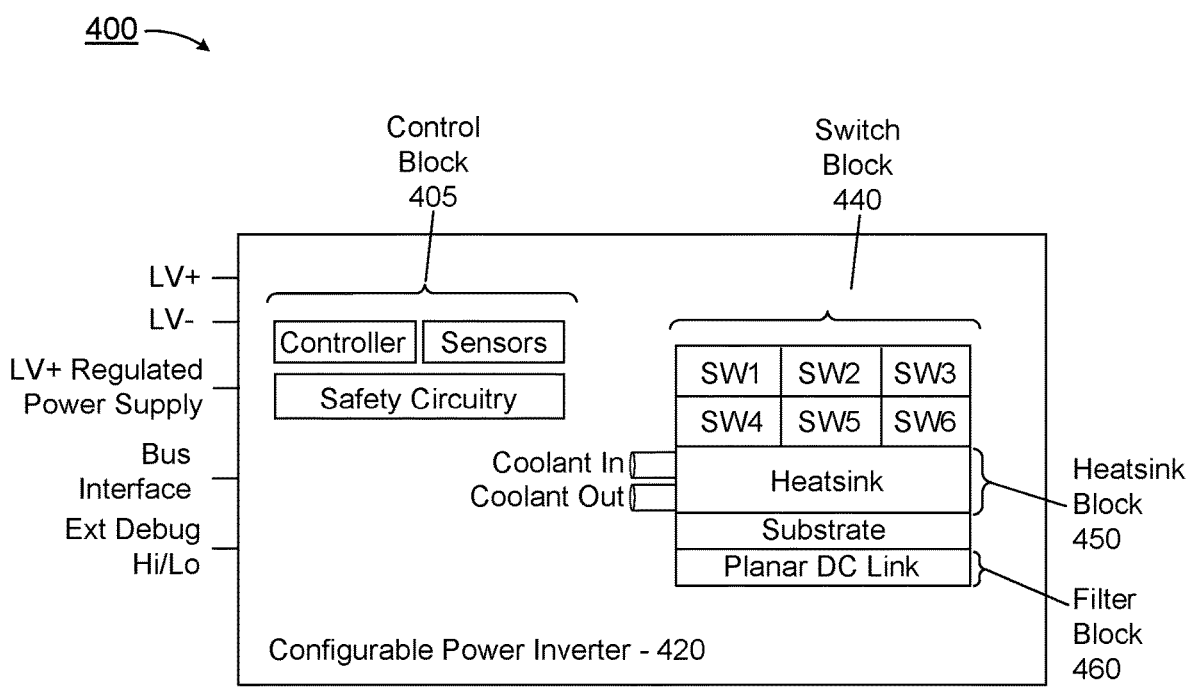
FIG. 4 is a block diagram of an example configurable power inverter module, according to an embodiment.

FIG. 4 is a block diagram of an example configurable power inverter 420, in accordance with an embodiment 400. In the embodiment of FIG. 4, configurable power inverter 420 includes many of the same features, aspects, and characteristics of configurable power inverter 120 of FIG. 1 and FIG. 2. Configurable power inverter 420 may include a prepackaged electronics module having signal input ports to receive a direct current voltage, such as input ports LV+ and LV−. In some implementations, a chassis ground may operate as a return. Further, configurable power inverter 420 may include a plurality of output power ports, such as ports to provide single-phase, two-phase, or three-phase alternating current output power. Further, configurable power inverter 420 may include one or more signal ports, which receive commands or other input signals to select single-phase, two-phase, or three-phase alternating current output power. Configurable power inverter 420 may perform voltage inversion functions via switch block 440, or more specifically switching circuitry, which may include any number of switching devices, such as MOSFET switching devices. In particular embodiments, MOSFET switching devices or other transistor elements of switch block 440 may include, for example, gallium nitride, silicon carbide, or any other semiconductor material having a relatively wide bandgap. In this context, the term "wide bandgap" refers to a semiconductor material having a bandgap between valence and conduction bands of at least 2.5 electron Volts. In particular embodiments, a configurable power inverter 420 may include MOSFET-based switching devices that utilize gallium nitride or silicon carbide as an active material. Use of gallium nitride or silicon carbide, for example, may bring about greater switching efficiency, increased heat tolerance, which may permit a prepackaged configurable power inverter 420 to operate within a smaller volume envelope. An additional benefit of a relatively wide bandgap material may relate to increased switching speeds of, for example, gallium nitride or silicon carbide, in relation to silicon-based MOSFET switching devices.

Configurable power inverter 420 may additionally include control block 405, which may include a switch controller, safety circuitry, and one or more sensors. In particular embodiments, the controller and sensors of configurable power inverter 420 may cooperate to provide soft turn on and zero-current switching, such as described in relation to FIGS. 2, 3A, and 3B, hereinabove. Thus, in particular embodiments, the controller of control block 405 may facilitate a first switching device (e.g., SW1) to generate a positive portion of an alternating current waveform. A positive portion of an AC waveform may begin by gradually increasing a control voltage (also referred to as a control voltage value or control voltage amplitude) to a switching device (e.g., a gate voltage of a MOSFET switching device) so as to increase current conducted through the switching device. This current may flow in a first direction and form the positive portion of the AC waveform. This current may be increased in amplitude, from a negligible amplitude to a saturation current amplitude, so as to increase an amplitude of the positive portion of the AC waveform. Following attaining saturation current (e.g., $I_{SAT}$) for a predetermined length of time, the switch controller of control block 405 may gradually decrease a control voltage to the switching device, thereby operating to gradually decrease current conducted through the switching device, and thus decrease an amplitude of the positive portion of the AC waveform. Responsive to sensors of control block 405 indicating that current conducted through a switching device of switch block 440 has fallen below a threshold value, the controller of control block 405 may operate to gradually increase current conducted through a second switching device (e.g., SW4), thereby facilitating the second switching device to generate a negative portion of an AC waveform, and more particularly to increase an amplitude of the negative portion of the AC waveform. The switch controller may further subsequently decrease the current conducted through the second switching device, so as to decrease an amplitude of the negative portion of the AC waveform. The controller of control block 405 may cooperate with additional switches of switch block 440 (e.g., SW2 and SW3) to generate positive portions of additional phases of AC waveforms and may cooperate with other switches of switch block 440 (e.g., SW5 and SW6) to generate negative portions of additional phases of alternating current waveforms. Control block 405 may communicate via a serial interface, for example, in which the serial interface facilitates programming of one or more logic modules of the control block so as to generate or form substantially zero-current switching of switch elements and/or switching circuitry of the switch block.

In particular embodiments, configurable power inverter 420 may additionally include heatsink block 450, which may include a heatsink to operate to absorb excess thermal energy generated by switching devices of switch block 440. In some instances, based at least in part on switching devices SW1-SW6, for example, generating significant excess thermal energy, heatsink block 450 may include provisions for liquid cooling of the heatsink. For example, heatsink block 450 may include conduits to receive a liquid coolant at a relatively low temperature and to expel liquid coolant at a relatively high temperature. In other instances, based at least in part on switching devices SW1-SW6, for example, generating a lesser amount of excess thermal energy, heatsink block 450 may include provisions for air cooling of switch block 440. Such provisions may include cooling fins, airflow ducts, cooling fans, etc.

As stated above, configurable power inverter 120/420 is operable to convert DC input power to AC output power. In particular embodiments, configurable power inverter 420 may additionally include a filter block 460 coupled to a substrate. In the embodiment of FIG. 4, filter block 460 may include one or more capacitive devices to provide DC-link capacitance between a portion of the DC input power (which may also be referred to as DC input power portion) and a portion of the AC output power (also referred to as AC output power portion). More specifically, the one or more capacitive devices may include a DC link capacitor operating to decouple effects of stray (e.g., parasitic) inductance presented by direct current input ports, such as LV+ and LV−. Through such decoupling, voltage ripple present on direct current input ports may be filtered from output signals comprising single-phase, two-phase, or three-phase power. In particular embodiments, if heatsink block 450 includes a substantially flat, planar surface, filter block 460 may include a planar capacitor coupled to the substrate. In turn, the substrate may be coupled to heatsink block 450.

Figure 5:
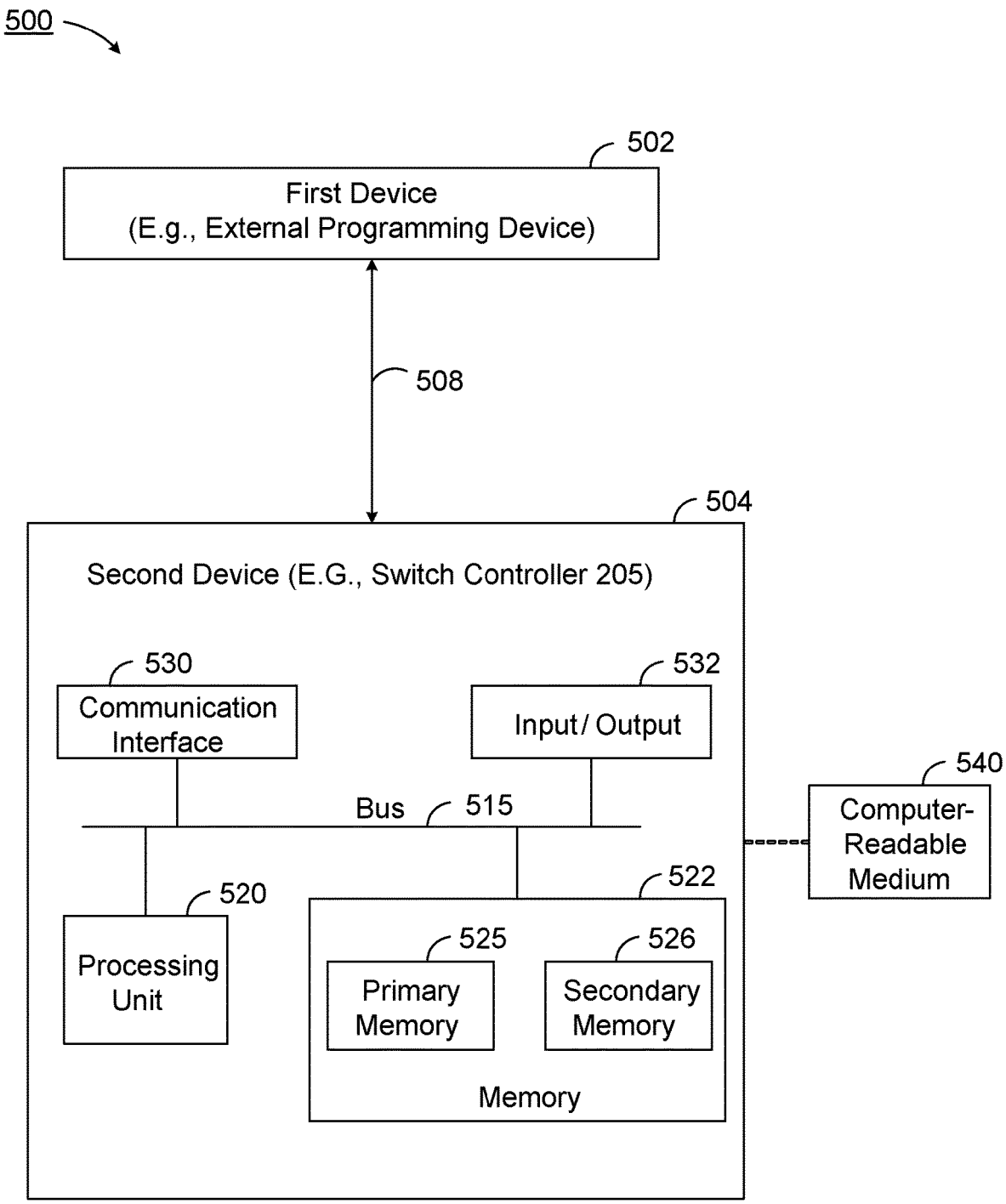
FIG. 5 is a schematic block diagram illustrating an example computing system environment, according to an embodiment.

FIG. 5 is a schematic block diagram illustrating an example programming device in communication with a switch controller, according to an embodiment 500. In the embodiment of FIG. 5, first device 502 may represent an external device utilized to program a second device (504), which may include or correspond to switch controller 205 of FIG. 2. First and second devices 502 and 504 may communicate via wired interface 508. Second device 504 may include processing unit 520 and memory 522, which may communicate with each other via bus 515. However, in particular embodiments, functionality of second device 504 may correspond to a lower-level digital logic controller that operates utilizing a fixed set of instructions rather than a general-purpose microprocessor capable of executing to perform a variety of computer-implementable functions. Memory 522 may include primary memory 525 and secondary memory 526 and may communicate with first device 502 by way of a communication interface 530, for example. Input/output 532 may correspond to switch elements, switching circuitry, and/or switching devices, which operate to receive DC input power and output AC power. Second device 504, as depicted in FIG. 5, is merely one example, and claimed subject matter is not limited in scope to this particular example.

In FIG. 5, first device 502 may provide one or more sources of executable computer instructions in the form of physical states and/or signals (e.g., stored in memory states), for example. Although first device 502 is indicated as communicating via a wired interface with second device 504, subject matter is intended to embrace wireless communications between first device 502 and second device 504. Further, although second device 504 of FIG. 5 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 522 may include any non-transitory storage mechanism. Memory 522 may include, for example, primary memory 525 and secondary memory 526, additional memory circuits, mechanisms, or combinations thereof may be used. Memory 522 may include, for example, random access memory, read only memory, etc., such as in the form of one or more storage devices and/or systems, such as, for example, a random access memory (RAM), a read-only memory (ROM), an erasable programmable read-only memory (EPROM or Flash memory), a static random access memory (SRAM), and/or dynamic random access memory (DRAM). Other examples of the memory may include a hard disk drive (HDD), a solid state drive (SDD) or solid state integrated memory, a portable compact disc read-only memory (CD-ROM), a digital versatile disk (DVD), and/or a memory stick.

Memory 522 may include one or more articles utilized to store a program of executable computer instructions. For example, processing unit 520 may fetch executable instructions from memory and proceed to execute the fetched instructions. Memory 522 may also include a memory controller for accessing device readable-medium 540 that may carry and/or make accessible digital content, which may include code, and/or instructions, for example, executable by processing unit 520 and/or some other device, such as a controller, as one example, capable of executing computer instructions, for example. Under direction of processing unit 520, a non-transitory memory, such as memory cells storing physical states (e.g., memory states), comprising, for example, a program of executable computer instructions, may be executed by processing unit 520.

Algorithmic descriptions and/or symbolic representations are examples of techniques used by those of ordinary skill in the signal processing and/or related arts to convey the substance of their work to others skilled in the art. An algorithm is, in the setting or environment of the present patent application, and generally, is considered to be a self-consistent sequence of operations and/or similar signal processing leading to a desired result. In the setting or environment of the present patent application, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

Processing unit 520 may include one or more circuits, such as digital circuits, to perform at least a portion of a computing procedure and/or process. By way of example, but not limitation, processing unit 520 may include one or more processors, such as controllers, micro-processors, micro-controllers, application specific integrated circuits, digital signal processors, programmable logic devices, field programmable gate arrays, the like, or any combination thereof. In various implementations and/or embodiments, processing unit 520 may perform signal processing, typically substantially in accordance with fetched executable computer instructions, such as to manipulate signals and/or states, to construct signals and/or states, etc., with signals and/or states generated in such a manner to be communicated and/or stored in memory, for example.

A "processor," for example, is understood to refer to a specific structure such as a central processing unit (CPU) of a computing device which may include a control unit and an execution unit, and/or any of the other examples discussed above (e.g., SoC, ASIC). In an aspect, a processor may include a device that interprets and executes instructions to process input signals to provide output signals. As such, in the context of the present patent application at least, computing device and/or processor are understood to refer to sufficient structure within the meaning of 35 USC § 112(f) so that it is specifically intended that 35 USC § 112(f) not be implicated by use of the term "computing device," "processor" and/or similar terms; however, if it is determined, for some reason not immediately apparent, that the foregoing understanding cannot stand and that 35 USC § 112(f), therefore, necessarily is implicated by the use of the term "computing device," "processor," "processing unit," and/or similar terms, then, it is intended, pursuant to that statutory section, that corresponding structure, material and/or acts for performing one or more functions be understood and be interpreted to be described at least in FIGS. 1-5 and in the text associated with the foregoing figure(s) of the present patent application.

In the setting or environment of the present patent application, the term "connection," the term "component" and/or similar terms are intended to be physical, but are not necessarily always tangible. Whether or not these terms refer to tangible subject matter, thus, may vary in a particular circumstance of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc.

In a particular circumstance of usage, such as the particular circumstances in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, "coupled" is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the setting or environment of the present patent application, since memory, such as a memory component and/or memory states, is intended to be non-transitory, the term physical, at least if used in relation to memory necessarily implies that such memory components and/or memory states, continuing with the example, are tangible.

Unless otherwise indicated, in the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, that the particular situation be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall with the abstract idea judicial exception to statutory subject matter. Rather, it is asserted, that physical measurements are not mental steps and, likewise, are not abstract ideas.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

For example, a relatively large number of measurements may be collected to better estimate a deterministic component. Likewise, if measurements vary, which may typically occur, it may be that some portion of a variance may be explained as a deterministic component, while some portion of a variance may be explained as a random component. Typically, it is desirable to have stochastic variance associated with measurements be relatively small, if feasible. That is, typically, it may be preferable to be able to account for a reasonable portion of measurement variation in a deterministic manner, rather than a stochastic matter as an aid to identification and/or predictability.

Along these lines, a variety of techniques have come into use so that one or more measurements may be processed to better estimate an underlying deterministic component, as well as to estimate potentially random components. These techniques, of course, may vary with details surrounding a given situation. Typically, however, more complex problems may involve the use of more complex techniques. In this regard, as alluded to above, one or more measurements of physical manifestations may be modeled deterministically and/or stochastically. Employing a model permits collected measurements to potentially be identified and/or processed, and/or potentially permits estimation and/or prediction of an underlying deterministic component, for example, with respect to later measurements to be taken. A given estimate may not be a perfect estimate; however, in general, it is expected that on average one or more estimates may better reflect an underlying deterministic component, for example, if random components that may be included in one or more obtained measurements, are considered. Practically speaking, of course, it is desirable to be able to generate, such as through estimation approaches, a physically meaningful model of processes affecting measurements to be taken.

In some situations, however, as indicated, potential influences may be complex. Therefore, seeking to understand appropriate factors to consider may be particularly challenging. In such situations, it is, therefore, not unusual to employ heuristics with respect to generating one or more estimates. Heuristics refers to the use of experience related approaches that may reflect realized processes and/or realized results, such as with respect to use of historical measurements, for example. Heuristics, for example, may be employed in situations where more analytical approaches may be overly complex and/or nearly intractable. Thus, regarding claimed subject matter, an innovative feature may include, in an example embodiment, heuristics that may be employed, for example, to estimate and/or predict one or more measurements.

The terms "correspond," "reference," "associate," and/or similar terms relate to signals, signal samples and/or states, e.g., components of a signal measurement vector, which may be stored in memory and/or employed with operations to generate results, depending, at least in part, on the above-mentioned, signal samples and/or signal sample states. For example, a signal sample measurement vector may be stored in a memory location and further referenced wherein such a reference may be embodied and/or described as a stored relationship. A stored relationship may be employed by associating (e.g., relating) one or more memory addresses to one or more another memory addresses, for example, and may facilitate an operation, involving, at least in part, a combination of signal samples and/or states stored in memory, such as for processing by a processor and/or similar device, for example. Thus, in a particular context, "associating," "referencing," and/or "corresponding" may, for example, refer to an executable process of accessing memory contents of two or more memory locations, for example, to facilitate execution of one or more operations among signal samples and/or states, wherein one or more results of the one or more operations may likewise be employed for additional processing, such as in other operations, or may be stored in the same or other memory locations, as may, for example, be directed by executable instructions. Furthermore, terms "fetching" and "reading" or "storing" and "writing" are to be understood as interchangeable terms for the respective operations, e.g., a result may be fetched (or read) from a memory location; likewise, a result may be stored in (or written to) a memory location.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," if the minor variations are sufficiently minor so that the feature, structure, characteristic, and/or the like would still be considered to be substantially present with such variations also present. Thus, continuing with this example, the terms electrical-type and/or electrical-like properties are necessarily intended to include electrical properties. It should be noted that the specification of the present patent application merely provides one or more illustrative examples and claimed subject matter is intended to not be limited to one or more illustrative examples; however, again, as has always been the case with respect to the specification of a patent application, particular circumstances of the description and/or usage provides helpful guidance regarding reasonable inferences to be drawn.

With advances in technology, it has become more typical to employ distributed computing and/or communication approaches in which portions of a process, such as implementing control functions, for example, may be allocated among various devices within a vehicle via a communications network, such as a CAN or a LIN. Such networks may include two or more devices which may communicate in the form of signal packets and/or signal frames (e.g., including one or more signal samples).

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. An electronics module to operate as a configurable power inverter, the electronics module comprising:
   switching circuitry arranged to convert direct current (DC) input power into single-phase, two-phase, or three-phase alternating current (AC) output power, the switching circuitry comprising a plurality of switching devices, at least two switching devices of the plurality of switching devices respectively coupled to each of a plurality of AC power outputs;
   one or more switch controllers to operate to:
   receive, as a first set of input signals, input signals from a communications bus to direct operation of the switching circuitry to generate the single-phase, two-phase, or three-phase AC output power; and to
   receive, as a second set of input signals, input signals from the communications bus to implement soft turn on of the AC output power by gradually increasing a switch current applied to the plurality of switching devices from a negligible amount to a saturation amount over a particular time duration and substantially zero-current switching of the AC output power by performing a switching operation for a second switching device when conducted current in a first switching device is determined to have fallen below a threshold value.

2. The electronics module of claim 1, further comprising: a heatsink, coupled to the switching circuitry, to receive thermal energy generated by the switching circuitry.

3. The electronics module of claim 2, wherein the heatsink comprises provisions for liquid cooling of the heatsink.

4. The electronics module of claim 2, further comprising a substrate in contact with the heatsink, the substrate to accommodate one or more capacitive devices to provide DC-link capacitance between a DC input power portion, which is a portion of the DC input power, and an AC output power portion, which is a portion of the AC output power, of the electronics module.

5. The electronics module of claim 4, wherein at least one capacitive device of the one or more capacitive devices comprises a planar capacitor.

6. The electronics module of claim 1, wherein the communications bus includes or is a part of a controller area network (CAN) or a local interconnect network (LIN) communications bus.

7. The electronics module of claim 1, wherein the electronics module receives the DC input power to have a voltage of between approximately 12.0 Volts and approximately 60.0 Volts, and wherein the one or more switch controllers receive at least one regulated voltage supply of approximately 12.0 Volts.

8. The electronics module of claim 1, wherein the switching circuitry comprises transistor elements that utilize a semiconductor material having a band gap of at least 2.5 electron volts.

9. The electronics module of claim 8, wherein the semiconductor material comprises silicon carbide or gallium nitride.

10. An electronics module, comprising:
    a switch block, the switch block to receive direct current (DC) power and to generate alternating current (AC) power, the switch block comprising a plurality of switching devices, at least two switching devices of the plurality of switching devices respectively coupled to each of a plurality of AC power outputs;
    a control block, the control block to direct transmitted signals to the switch block, the transmitted signals to: (i) direct the switch block to generate single-phase, two-phase, or three-phase AC output power; (ii) implement soft turn on of the AC output power by gradually increasing a switch current applied to the plurality of switching devices from a negligible amount to a saturation amount over a particular time duration; and (iii) implement substantially zero-current switching of the plurality of switching devices by performing a switching operation for a second switching device when conducted current in a first switching device is determined to have fallen below a threshold value;
    a heatsink block, the heatsink block to receive thermal energy from the switch block and to dissipate the thermal energy; and
    a filter block coupled to the heatsink block, the filter block to introduce a capacitance between an input power portion of the switch block and an output power portion of the switch block.

11. The electronics module of claim 10, wherein the filter block further comprises a substrate, coupled to the heatsink block, to accommodate components of the filter block.

12. The electronics module of claim 11, wherein the filter block comprises at least one planar capacitor.

13. The electronics module of claim 10, wherein the switch block further comprises a first power port to receive input power of between approximately 12 Volts and approximately 60 Volts.

14. The electronics module of claim 10, wherein the control block further comprises a second power port to receive input power of between approximately 9 Volts and approximately 14 Volts.

15. The electronics module of claim 10, wherein the control block further comprises a serial interface, the serial interface to facilitate programming of one or more logic modules of the control block.

16. The electronics module of claim 15, wherein the programming of the one or more logic modules of the control block are operable to receive commands to generate zero-current switching of switch elements of the switch block.

17. A vehicle, comprising:
one or more batteries;
one or more input power ports to receive direct current (DC) power;
a prepackaged electronics module comprising:
  a plurality of output power ports to provide single-phase, two-phase, or three-phase alternating current (AC) power;
  a first set of one or more input signal ports, the first set of one or more input signal ports to receive commands to select the single-phase, the two-phase, or the three-phase AC power;
  a plurality of switch elements configured to be switched in accordance with the commands received by the first set of one or more input signal ports, at least two switch elements of the plurality of switch elements respectively coupled to each of the plurality of output power ports; and
  a second set of one or more input signal ports, the second set of the one or more input signal ports to receive programming commands, the programming commands to bring about: soft turn on of the AC power by gradually increasing a switch current applied to the plurality of switch elements from a negligible amount to a saturation amount over a particular time duration, and substantially zero-current switching of the plurality of switch elements by performing a switching operation for a second switch element of the plurality of switch elements when conducted current in a first switch element of the plurality of switch elements is determined to have fallen below a threshold value, and
one or more pieces of equipment of the vehicle to receive the single-phase, the two-phase, or the three-phase AC power.

18. The vehicle of claim 17, wherein the prepackaged electronics module of claim 17, further comprises:
a heatsink; and
one or more fluid input ports to receive a fluid from an external source and to convey the fluid to the heatsink.

* * * * *